United States Patent [19]
Murari et al.

[11] 4,293,824
[45] Oct. 6, 1981

[54] LINEAR DIFFERENTIAL AMPLIFIER WITH UNBALANCED OUTPUT

[75] Inventors: Bruno Murari, Monza; Marco Siligoni, Vittuone, both of Italy

[73] Assignee: SGS-ATES Componenti Elettronici S.p.A., Agrate Brianza, Italy

[21] Appl. No.: 90,619

[22] Filed: Nov. 2, 1979

[30] Foreign Application Priority Data

Nov. 3, 1978 [IT] Italy .................. 29388 A/78

[51] Int. Cl.³ .......................... H03F 3/04; H03F 3/45
[52] U.S. Cl. ................................ 330/301; 330/252; 330/311
[58] Field of Search ............. 330/252, 257, 301, 311

[56] References Cited

PUBLICATIONS

K. B. Klaassen, "Common-mode Filter", Delft Progress Report Series B (Neitherlands), vol. 1, No. 2, Jul. 1975, pp. 31–35.

*Primary Examiner*—James B. Mullins
*Assistant Examiner*—Gene Wan
*Attorney, Agent, or Firm*—Karl F. Ross

[57] ABSTRACT

A linear differential amplifier comprises two main transistors of one conductivity type (e.g. PNP) having emitters connected via a common constant-current generator to an ungrounded terminal of a d-c supply whose grounded other terminal is connected to their collectors via a pair of identical resistors; the base of one of these transistors is grounded while the base of the other transistor receives an a-c input signal. An unbalanced output signal is taken off the collector of an ancillary transistor of the opposite conductivity type (NPN) which is fed from the ungrounded supply terminal through a complementary auxiliary transistor or through another constant-current generator; the emitter of this output transistor is connected directly to the collector of the second main transistor.

6 Claims, 5 Drawing Figures

LINEAR DIFFERENTIAL AMPLIFIER WITH UNBALANCED OUTPUT

FIELD OF THE INVENTION

Our present invention relates to a linear differential amplifier designed to convert an input signal, applied between a pair of differential terminals, into an unbalanced output signal. Such an amplifier may be used, for example, as an input stage of an operational amplifier.

BACKGROUND OF THE INVENTION

Conventional amplifiers of this class comprise two symmetrical main transistors of one and the same conductivity type with emitters connected in parallel to an ungrounded terminal of a d-c supply via a common constant-current generator. In a prior system the collector of one of these main transistors is connected to a ground supply terminal through the forward resistance of a diode while the collector of the other main transistor is grounded via an ancillary, complementary transistor having is base/emitter circuit connected across that diode. When the base of the first main transistor receives an input signal, the base of the second main transistor being grounded, an unbalanced output signal appears on the interconnected collectors of the second main transistor and of the ancillary transistor in series therewith. In order to compensate for the voltage drop across the diode and the substantially identical voltage drop across the base/emitter junction of the ancillary transistor, the input signal and the zero potential of the grounded supply terminal may be fed to the bases of the two main transistors not directly but through the base/emitter paths of two supplemental transistors connected therewith in a Darlington configuration. The presence of these supplemental input transistors, however, adversely affects the noise factor and the offset voltage of the differential amplifier.

OBJECT OF THE INVENTION

The object of our present invention, therefore, is to provide an improved differential amplifier of the general kind referred to above but with a reduced noise factor and offset voltage.

SUMMARY OF THE INVENTION

We realize this object, in accordance with our present invention, by providing a first and a second biasing resistor of substantially identical magnitudes respectively inserted between the collectors of the two main transistors and the grounded supply terminal. The ancillary transistor, emitting the output signal at its collector, is no longer in series with the second main transistor but has its emitter grounded through the biasing resistor thereof while its collector is connected to the ungrounded supply terminal by way of resistance means such as another constant-current generator or an auxiliary transistor, for example, its base being connected to a biasing network inserted between the two supply terminals.

This arrangement dispenses with the need for two supplemental transistors in Darlington configuration so that only the two main transistors form part of the differential component of the amplifier, with resulting reduction of the noise and offset voltage.

BRIEF DESCRIPTION OF THE DRAWING

The above and other features of our present invention will now be described in detail with reference to the accompanying drawing in which.

SPECIFIC DESCRIPTION

Figure 1:
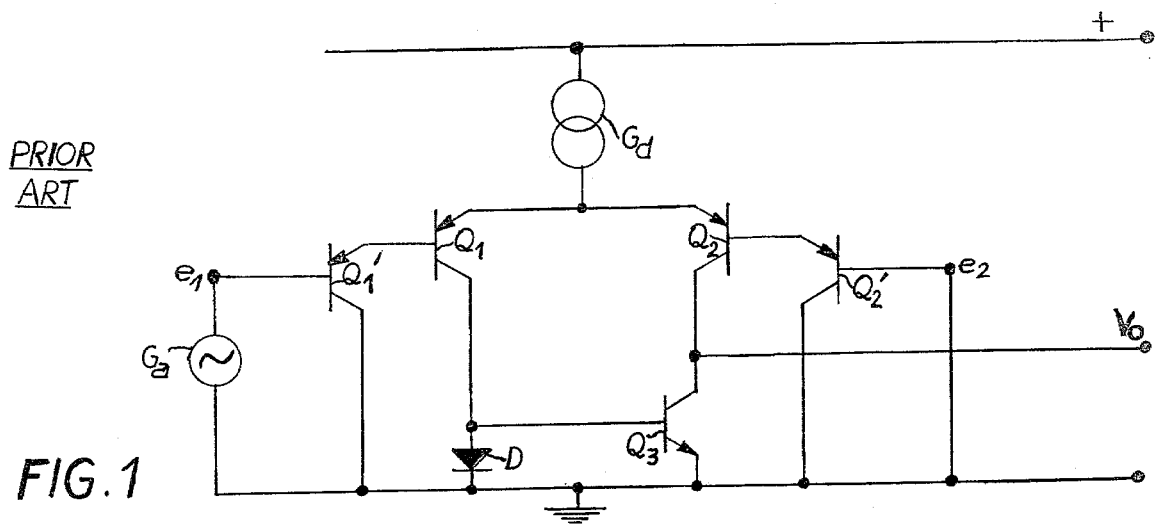
FIG. 1 is a circuit diagram of a conventional differential amplifier of the type here envisaged.

In FIG. 1 we have shown a conventional differential amplifier with the structure described above, comprising two main transistors $Q_1$, $Q_2$ of PNP conductivity type whose emitters are connected by way of a constant-current generator $G_d$ to the positive terminal of a supply of direct current with grounded negative terminal. The collectors of transistors $Q_1$ and $Q_2$ are grounded by way of a diode D and an ancillary NPN-type transistor $Q_3$, respectively; the base and emitter of transistor $Q_3$ are connected across diode D while its collector, joined to the collector of transistor $Q_2$, represents the output terminal of the amplifier emitting an unbalanced signal $V_o$. Two supplemental PNP transistors $Q_1'$ and $Q_2'$ are inserted in Darlington configuration between ground and the bases of main transistors $Q_1$ and $Q_2$, respectively. The bases of transistors $Q_1'$ and $Q_2'$ constitute the input terminals of the amplifier and are designed to receive separate input signals $e_1$ and $e_2$ whose difference is to be amplified. In the system shown in FIG. 1, only the base of transistor $Q_1'$ receives a signal $e_1$ from an alternating-current source $G_a$ while the base of transistor $Q_2'$ is maintained at a fixed potential $e_2$, generally at ground level.

In the quiescent state, i.e. with $e_1 = e_2 = 0$, the voltage drop $V_{be}$ across the base/emitter junction of transistor $Q_1'$ essentially equals that across the forward resistance of diode D (as well as the base/emitter voltages of transistors $Q_3$ and $Q_2'$) so that the base and the collector of transistor $Q_1$ are at the same potential, this being also true of transistor $Q_2$. When the input signal $e_1$—which has no d-c component—goes negative, the collector/base junction of transistor $Q_1$ is forwardly biased and the transistor operates in the active region of its characteristic adjacent the boundary of the saturation region as long as signal $e_1$ does not exceed the collector/base saturation voltage $V_{cb\ sat}$ of the transistor $Q_1$; in the saturation region, i.e. with $e_1 > V_{cb\ sat}$, the output signal $V_o$ is distorted. The resulting increase in current flow through this transistor diminishes the conduction of its mate $Q_2$ while the larger voltage drop across diode D lowers the resistance of transistor $Q_3$ whereby output signal $V_o$ becomes less positive. In the following half-cycle of the input signal, the collector/base junction of transistor $Q_1$ is reverse-biased; this transistor then operates in the active region of its characteristic and the output signal $V_o$ is undistorted.

Figure 2:
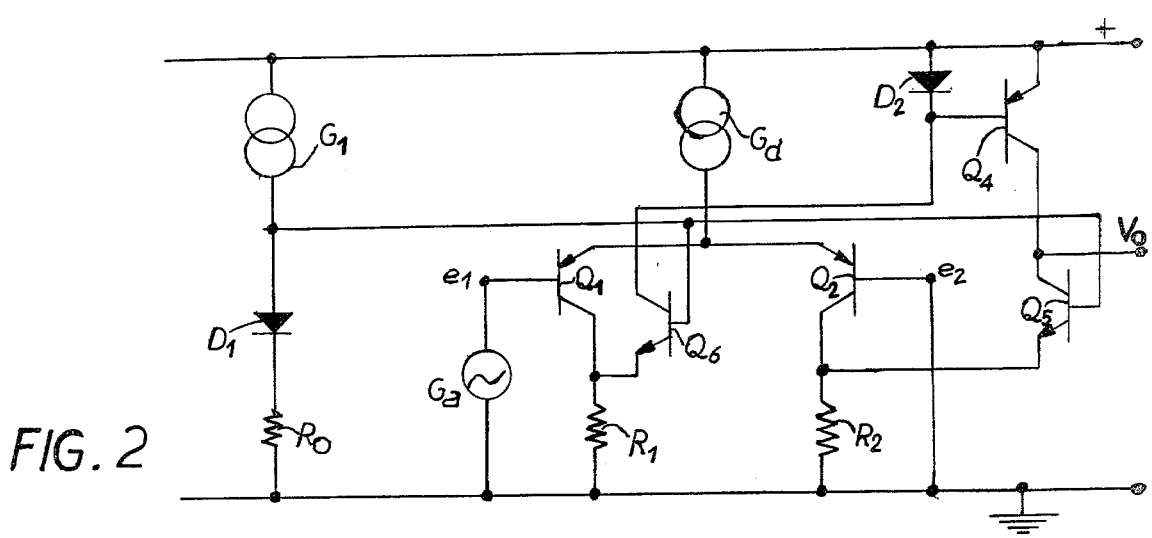
FIGS. 2–5 are similar circuit diagrams showing different embodiments of our present invention.

In FIG. 2 we have illustrated an improve differential amplifier according to our invention in which the collectors of main transistors $Q_1$ and $Q_2$ are grounded by way of respective biasing resistors $R_1$ and $R_2$ of like magnitude, with omission of supplemental transistors $Q_1'$ and $Q_2'$; the bases of these main transistors are directly connected to the ungrounded terminal of signal source $G_a$ and to ground, respectively. Transistor $Q_3$ has been replaced by an ancillary NPN transistor $Q_5$ whose emitter is joined to the collector of transistor $Q_2$ and whose collector is connected to the positive supply terminal by way of an auxiliary PNP transistor $Q_4$. Another auxiliary transistor $Q_6$, of NPN type, connects the base of transistor $Q_4$ to the collector of transistor $Q_1$. The bases of transistors $Q_5$ and $Q_6$ are connected to a junction of another constant-current generator $G_1$ with a diode $D_1$ forming part, together with a resistor $R_O$, of a biasing network connected across the d-c supply. Another diode $D_2$ feeds positive voltage from the ungrounded supply terminal to the base of transistor $Q_4$ and to the collector of transistor $Q_6$.

In the quiescent state, with the bases of both main transistors $Q_1$ and $Q_2$ at ground potential, resistor $R_1$ is traversed by the collector current of transistor $Q_1$ as well as by an additional current flowing through diode $D_2$ and transistor $Q_6$. The resulting voltage drop $V_R$ across this resistor maintains positive potential on the collector of transistor $Q_1$ whose collector/base junction is therefore forwardly biased with a voltage drop $V_{cb}$ equal in magnitude to $V_R$. On the negative swing of input signal $e_1$, the output voltage $V_o$ is undistorted as long as voltage $e_1$ does not exceed the difference between the voltage drop $V_R$ and the saturation voltage $V_{cb\ sat}$ of transistor $Q_1$. On the positive half-cycle, the collector/base junction is reverse-biased and transistor $Q_1$ operates in the active region of its characteristic.

With the base of transistor $Q_4$ and the emitter of transistor $Q_5$ connected to ground by way of biasing resistors $R_1$ and $R_2$, respectively, the alternating signal $e_1$ causes the conductivity of these two transistors to vary in mutually opposite senses. Thus, the output signal $V_o$ taken as before from the collector of ancillary transistor $Q_5$ in an unbalanced amplified replica of the input signal $e_1$. While the dynamic range of the input signal $e_1$ will be somewhat less in this case than with the prior-art amplifier of FIG. 1, that range will still be sufficient for practical purposes; in any case, this loss in the dynamics of the amplifier is more than compensated by the advantage of reduced noise and offset voltage.

The system of FIG. 2, as well as those of FIGS. 3-5 described hereinafter, may be modified by interchanging the conductivity types of the PNP and NPN transistors with reversal of the polarity of the supply voltage, i.e. with a grounding of the positive instead of the negative d-c terminal.

Figure 3:
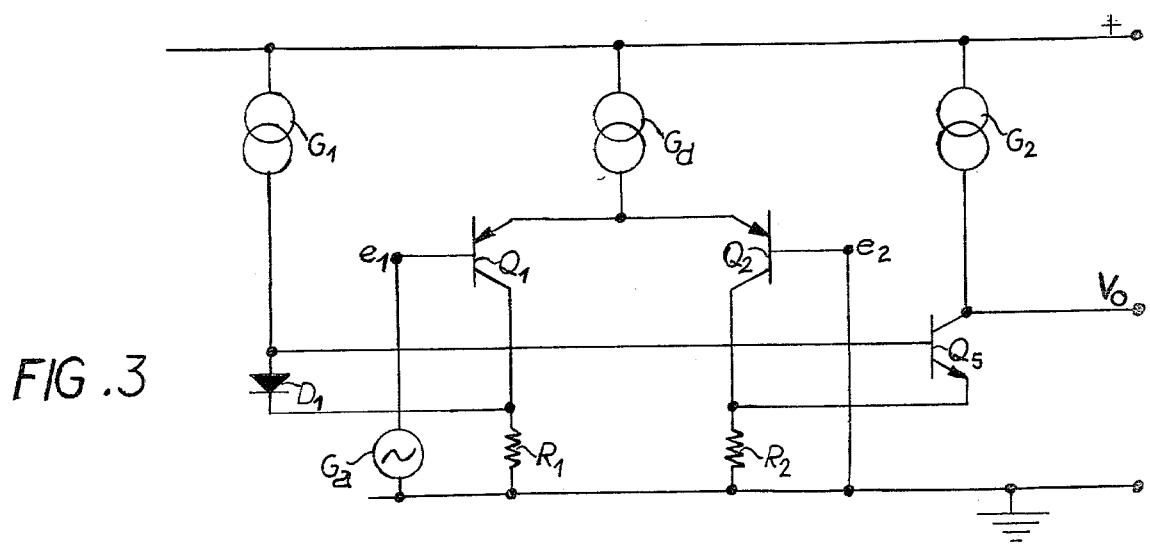

The differential amplifier shown in FIG. 3 has only the two main transistors $Q_1$, $Q_2$ and the ancillary transistor $Q_5$. The biasing network comprising constant-current generator $G_1$ and diode $D_1$ further includes, in this instance, the resistor $R_1$ in place of the resistor $R_O$ of FIG. 2; the base of transistor $Q_5$ is again tied to the junction of generator $G_1$ with diode $D_1$ whereas its collector is connected to positive voltage by way of a further constant-current generator $G_2$. The variations of input signal $e_1$ are reflected in mutually opposite changes of the base and emitter potentials of transistor $Q_5$, with resulting amplification of output signal $V_o$.

Figure 4:
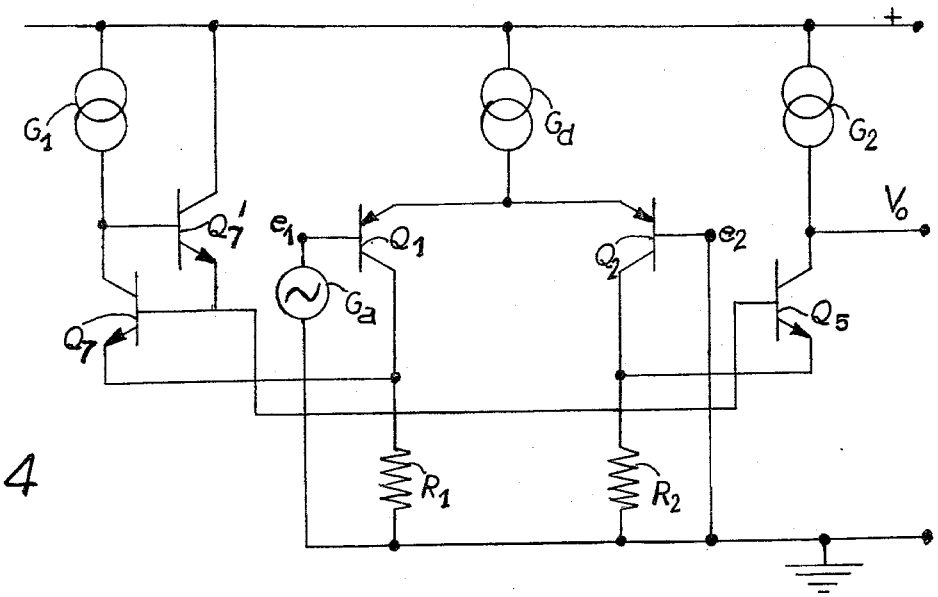

The system of FIG. 4 differs from that of FIG. 3 by the substitution of two PNP transistors $Q_7$ and $Q_7'$ for the diode $D_1$ in the biasing network including constant-current generator $G_1$ and resistor $R_1$. Transistor $Q_7'$, which provides negative feedback for transistor $Q_7$, has its collector directly connected to the positive supply terminal while its base is joined to the collector of transistor $Q_7$ and its emitter is tied to the interconnected bases of transistors $Q_5$ and $Q_7$.

Figure 5:
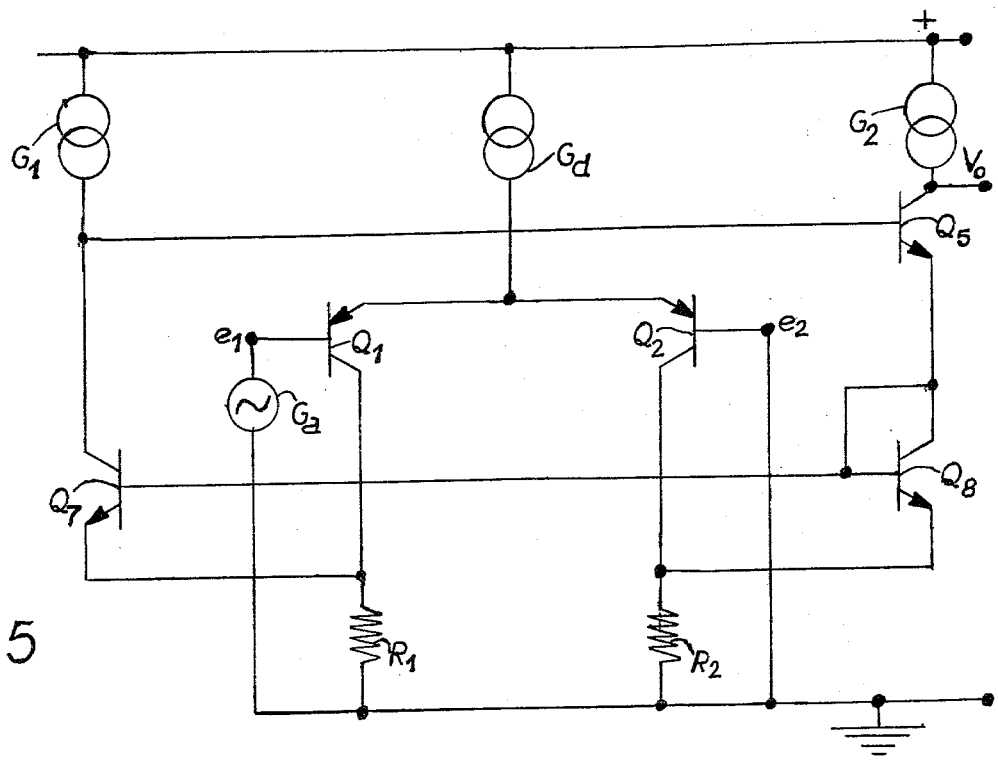

In FIG. 5 we have omitted the additional transistor $Q_7'$ associated with transistor $Q_7$ but have inserted a further NPN transistor $Q_8$, connected as a diode, between the emitter of ancillary transistor $Q_5$ and the resistor $R_2$. The anode of the diode, i.e. the collector and base of transistor $Q_8$ tied to the emitter of transistor $Q_5$, is joined to the base of transistor $Q_7$; this again provides negative feedback to stabilize the operation of transistor $Q_5$.

The mode of operation of the amplifiers of FIGS. 4 and 5 is essentially the same as that of the system shown in FIG. 3.

We claim:

1. A linear differential amplifier for converting an input signal into an unbalanced output signal, comprising:

a supply of direct current having a grounded terminal and an ungrounded terminal;

a first and a second main transistor for one conductivity type having emitters connected in parallel to said ungrounded terminal by way of a first constant-current generator and further having collectors respective connected to said grounded terminal via substantially identical first and second biasing resistors, said main transistors having respective bases between which said input signal is differentially applied;

voltage-control means inserted between said terminals in series with said first biasing resistor for maintaining across the latter a predetermined voltage drop in the absence of said input signal;

an ancillary transistor of opposite conductivity type having an emitter connected to ground through said second biasing resistor, a collector connected to said ungrounded terminal, and a base connected to said voltage-control means; and a second constant-current generator inserted between said ungrounded terminal and the collector of said ancillary transistor, said output signal being available at the last-mentioned collector.

2. A differential amplifier as defined in claim 1 wherein said voltage-control means comprises a further constant-current generator in series with a semiconductor component and with said first biasing resistor.

3. A differential amplifier as defined in claim 2 wherein said semiconductor component is a diode.

4. A differential amplifier as defined in claim 2 wherein said semiconductor component is a further transistor of said opposite conductivity type provided with a negative-feedback circuit.

5. A differential amplifier as defined in claim 4 wherein said negative-feedback circuit includes an additional transistor of said opposite conductivity type having a collector joined to said ungrounded terminal, a base joined to a collector of said further transistor and connected to said ungrounded terminal by way of said further constant-current generator, and an emitter jointed to a base of said further transistor and to the base of said ancillary transistor.

6. A differential amplifier as defined in claim 4 wherein said negative-feedback circuit includes a diode inserted between the emitter of said ancillary transistor and said second biasing collector.

* * * * *

UNITED STATES PATENT AND TRADEMARK OFFICE
CERTIFICATE OF CORRECTION

PATENT NO. : 4,293,824
DATED : Oct. 6, 1981
INVENTOR(S) : Bruno Murari and Marco Siligoni It is certified that error appears in the above-identified patent and that said Letters Patent is hereby corrected as shown below:

In claim 1, at line 21, replace 'for' with 'of'.

In claim 1, at line 25, replace 'respective' with 'respectively'.

Signed and Sealed this

Third Day of November, 1998

Attest:

BRUCE LEHMAN

*Attesting Officer*  *Commissioner of Patents and Trademarks*